(12) United States Patent
Li et al.

(10) Patent No.: US 9,217,768 B2
(45) Date of Patent: Dec. 22, 2015

(54) ELECTRONIC TESTING METHOD OF IN-CELL TOUCH SCREEN

(71) Applicants: Shanghai Tianma Micro-Electronics Co., Ltd., Shanghai (CN); Tianma Micro-Electronics Co., Ltd., Shenzhen (CN)

(72) Inventors: Jialing Li, Shanghai (CN); Conghua Ma, Shanghai (CN); Lihua Wang, Shanghai (CN); Qijun Yao, Shanghai (CN); Jun Ma, Shanghai (CN)

(73) Assignees: Shanghai Tianma Micro-Electronics Co., Ltd., Shanghai (CN); Tianma Micro-Electronics Co., Ltd., Shenzhen (CN)

(*) Notice: Subject to any disclaimer, the term of this patent is extended or adjusted under 35 U.S.C. 154(b) by 191 days.

(21) Appl. No.: 14/090,967

(22) Filed: Nov. 26, 2013

(65) Prior Publication Data

US 2014/0203816 A1  Jul. 24, 2014

(30) Foreign Application Priority Data

Jan. 24, 2013  (CN) .......................... 2013 1 0028001

(51) Int. Cl.
| | |
|---|---|
| G01R 31/02 | (2006.01) |
| G01R 31/28 | (2006.01) |
| G02F 1/13 | (2006.01) |
| G02F 1/1333 | (2006.01) |
| G06F 3/041 | (2006.01) |

(52) U.S. Cl.
CPC .......... *G01R 31/2812* (2013.01); *G02F 1/1309* (2013.01); *G02F 1/13338* (2013.01); *G06F 3/0416* (2013.01)

(58) Field of Classification Search
CPC ............... G09G 3/006; G01R 31/2812; G02F 1/13338; G02F 1/1309
USPC ................ 324/760.01, 760.02, 539–544
See application file for complete search history.

(56) References Cited

U.S. PATENT DOCUMENTS

| | | | |
|---|---|---|---|
| 7,649,586 B2 * | 1/2010 | Kim et al. ....................... | 349/54 |
| 2008/0170195 A1 | 7/2008 | Kwon et al. | |

(Continued)

FOREIGN PATENT DOCUMENTS

EP           1944648 A2      7/2008

OTHER PUBLICATIONS

Extended European Search Report from corresponding European Application No. 14152460.3, mailed on Jun. 2, 2014, 4 pages total.

*Primary Examiner* — Patrick Assouad
*Assistant Examiner* — Demetrius Pretlow
(74) *Attorney, Agent, or Firm* — Alston & Bird LLP (57) ABSTRACT

A method of electrically testing an in-cell touch screen is disclosed. The in-cell touch screen includes a display electrode, a driving line, and a detecting line. The detecting line intersects the driving line. The method includes floating the display electrode and performing at least one of: A) applying a first predetermined voltage to one column of adjacent columns of the driving line or one row of adjacent rows of the driving line, and grounding the other column of the adjacent columns or the other row of the adjacent rows, and B) applying a second predetermined voltage to one column of adjacent columns of the detecting line or one row of adjacent rows of the detecting line, and grounding the other column of the adjacent columns or the other row of the adjacent rows. The method also includes determining whether the driving line or the detecting line is shorted or opened.

13 Claims, 14 Drawing Sheets

(56) References Cited

U.S. PATENT DOCUMENTS

| | | | |
|---|---|---|---|
| 2009/0250268 A1* | 10/2009 | Staton et al. ............... | 178/18.06 |
| 2010/0158347 A1 | 6/2010 | He et al. | |
| 2012/0146657 A1* | 6/2012 | Casillan et al. ............... | 324/511 |
| 2012/0268413 A1* | 10/2012 | Narasimhan et al. ......... | 345/174 |
| 2012/0293336 A1* | 11/2012 | Pereverzev et al. ........... | 340/635 |
| 2012/0293455 A1* | 11/2012 | Shen et al. .................... | 345/174 |

* cited by examiner

FIG. 11 ns. Compared with the waveform judgment method, the capacitance direct measuring method neither needs to use an expensive special electrical device, nor has a complicated judgment rule. However, only the capacitance between one driving line and the ground or between one detecting line and the ground may be measured by each measurement of the capacitance direct measuring method, therefore it needs to spend relative long time to complete the measurement of a touch screen and the detection efficiency is very low, which may easily become the bottle neck of the capacity.

ELECTRONIC TESTING METHOD OF IN-CELL TOUCH SCREEN

CROSS-REFERENCES TO RELATED APPLICATIONS

The present application claims the benefit of priority to Chinese Patent Application No. 201310028001.2, entitled "ELECTRICAL TESTING METHOD OF IN-CELL TOUCH SCREEN", filed with the Chinese Patent Office on Jan. 24, 2013, the content of which is incorporated herein by reference in its entirety.

FIELD OF THE INVENTION

The present invention relates to the field of flat-panel display, and in particular to an electrical testing method of an in-cell touch screen.

BACKGROUND OF THE INVENTION

For an in-cell touch screen, a touch system is integrated with a display screen, which results in a reduced thickness and a simplified production process. Therefore the in-cell touch screen is popular used. Generally, a liquid crystal display includes a color film substrate and an array substrate. On the array substrate, there are many circuit designs. For a common in-cell touch screen, the touch system is provided on the side of the color film substrate.

Figure 1:
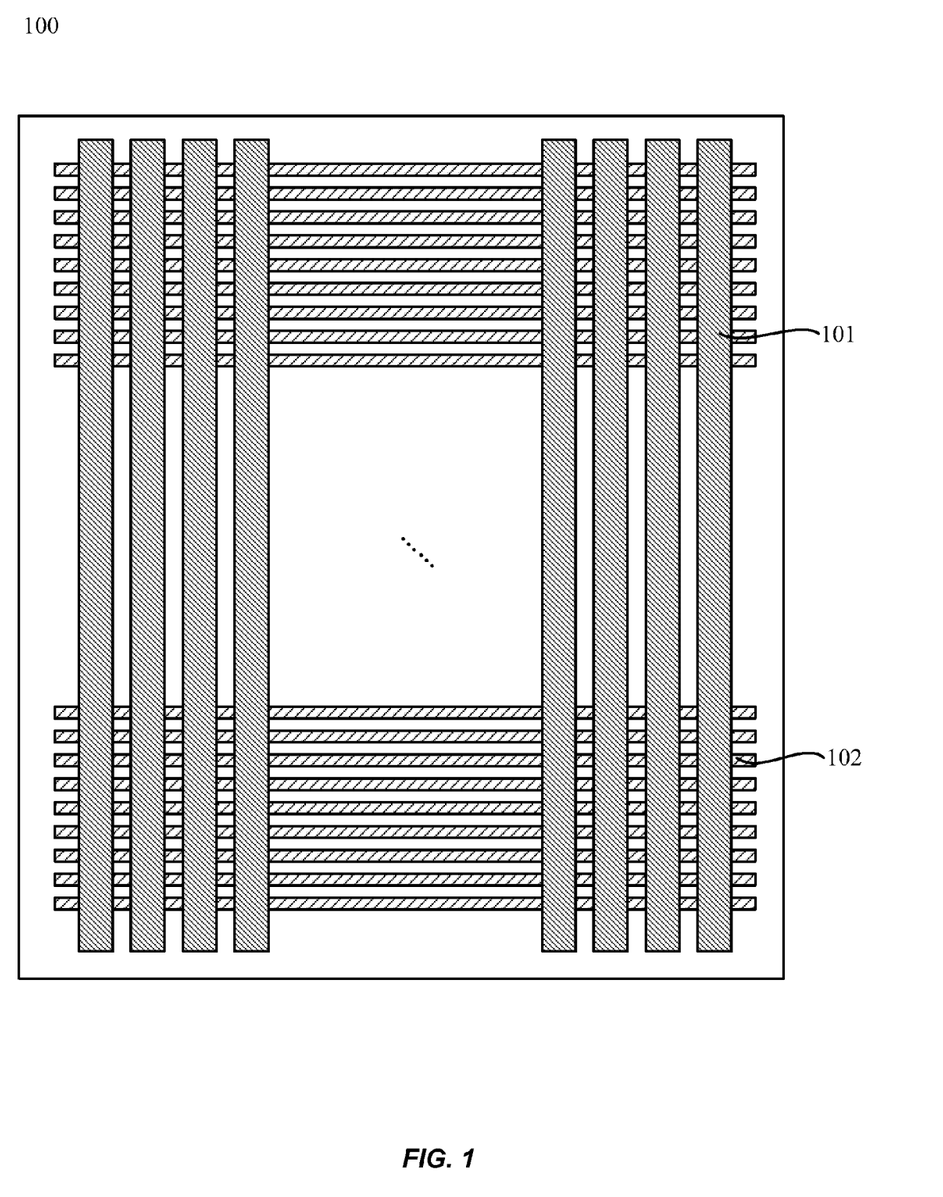
FIG. 1 is a schematic structural diagram of a touch layer of an in-cell touch screen according to the prior art.

As shown in FIG. 1, a touch layer 100 is integrated on the side of the color film substrate of the in-cell touch screen. The touch layer 100 includes driving lines 101 and detecting lines 102 which are intersected with each other in both horizon and vertical directions. There is provided with an insulating layer (not shown in the figure) between the driving line 101 and the detecting line 102 such that a touch capacitor is formed between the driving line 101 and the detecting line 102. In order to ensure the touch function of the touch layer 100, the driving line 101 and the detecting line 102 need to be electrically tested so as to determine whether the driving line 101 or the detecting line 102 is opened or shorted.

Generally, a waveform judgment method is adopted to perform electrical testing on a touch layer. Specifically, a special electrical device is adopted to apply a driving voltage to the driving line 101, meanwhile a voltage waveform signal is collected from the detecting line 102, thus a determining result of whether the driving line 101 or the detecting line 102 is opened, shorted or closed can be judged according to collected voltage waveform signals. However, a special device for waveform collection is usually used as the aforementioned special electrical device, which needs a cooperation of a special computer and software, thus the cost is relatively high. In addition, all judgments are performed by comparing the collected waveform signals, thus a judgment rule is complicated, and a professional training needs to be performed on testing personnel. Moreover, because the aforementioned detection and judgment is an artificial one, even for professionally-trained testing personnel, there still has a relatively high risk of misjudgment, thus further resulting in a raised detection cost and a relative lowered detection accuracy rate.

Furthermore, another detection method of an in-cell touch screen often used in the art is a capacitance direct measuring method. Specifically, the capacitance between each driving line and the ground or between each detecting line and the ground is measured by a multimeter, and a judgment of whether the driving line or the detecting line is opened or shorted is made according to the measured capacitance val-

BRIEF SUMMARY OF THE INVENTION

One inventive aspect is a method of electrically testing an in-cell touch screen. The in-cell touch screen including a display electrode, a driving line, and a detecting line, where the detecting line intersects the driving line. The method includes floating the display electrode and performing at least one of: A) applying a first predetermined voltage to one column of adjacent columns of the driving line or one row of adjacent rows of the driving line, and grounding the other column of the adjacent columns of the driving line or the other row of the adjacent rows of the driving line, and B) applying a second predetermined voltage to one column of adjacent columns of the detecting line or one row of adjacent rows of the detecting line, and grounding the other column of the adjacent columns of the detecting line or the other row of the adjacent rows of the detecting line. The method also includes observing a display picture of the in-cell touch screen, and determining whether the driving line or the detecting line is shorted or opened.

DETAILED DESCRIPTION OF THE INVENTION

In order to make the objects, technical solutions and advantages of the present invention to be clearer, detailed description will be further made in conjunction with the accompanying drawings.

Figure 2:
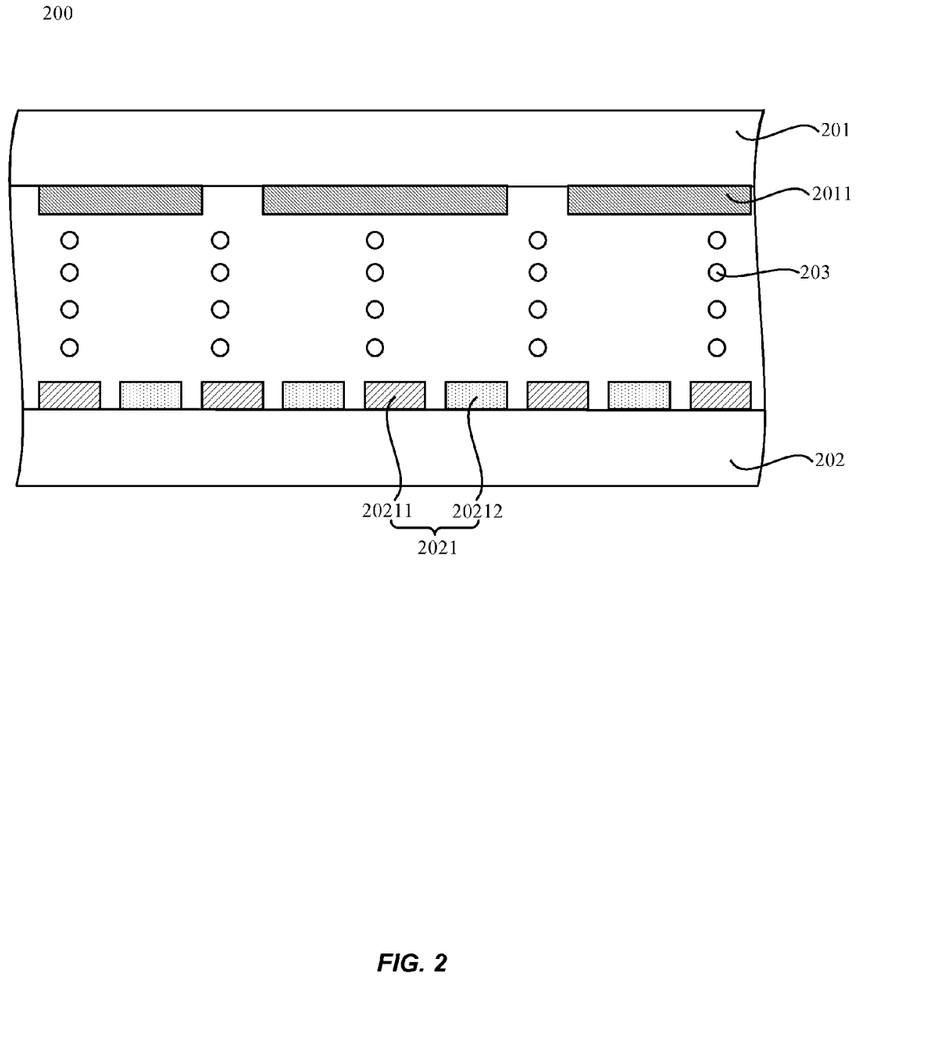
FIG. 2 is a schematic structural diagram of an in-cell touch screen according to an embodiment of the present invention.
Figure 3:
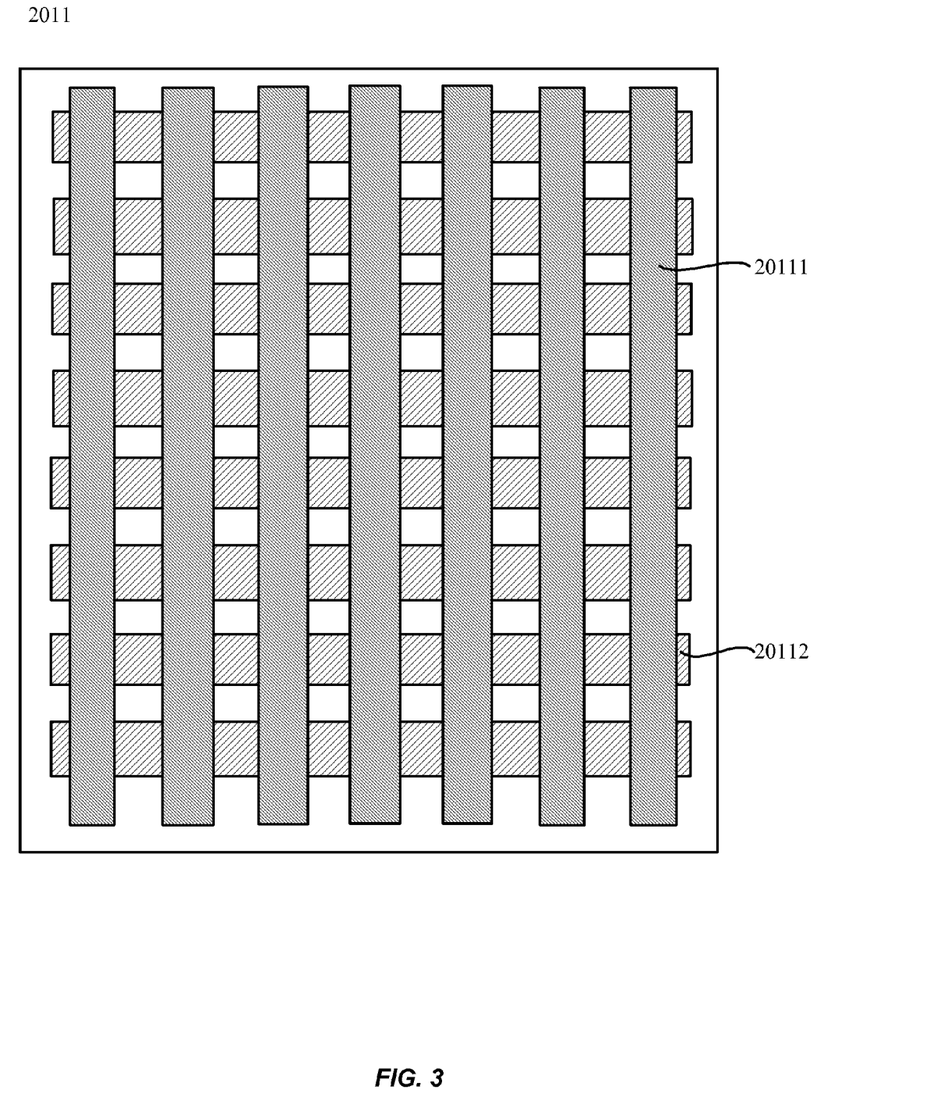
FIG. 3 is a top view of a touch layer according to an embodiment of the present invention.

As shown in FIG. 2, an in-cell touch screen 200 according to an embodiment of the present invention includes: a color film substrate 201, an array substrate 202 and a liquid crystal layer 203 arranged between the color film substrate 201 and the array substrate 202. Specifically, a touch layer 2011 is further integrated on the color film substrate 201, a display electrode 2021 is provided on the array substrate 202, and the display electrode 2021 includes a common electrode 20211 and a pixel electrode 20212. As shown in FIG. 3, the touch layer 2011 includes a driving line 20111 and a detecting line 20112 intersected with the driving line 20111.

Figure 4:
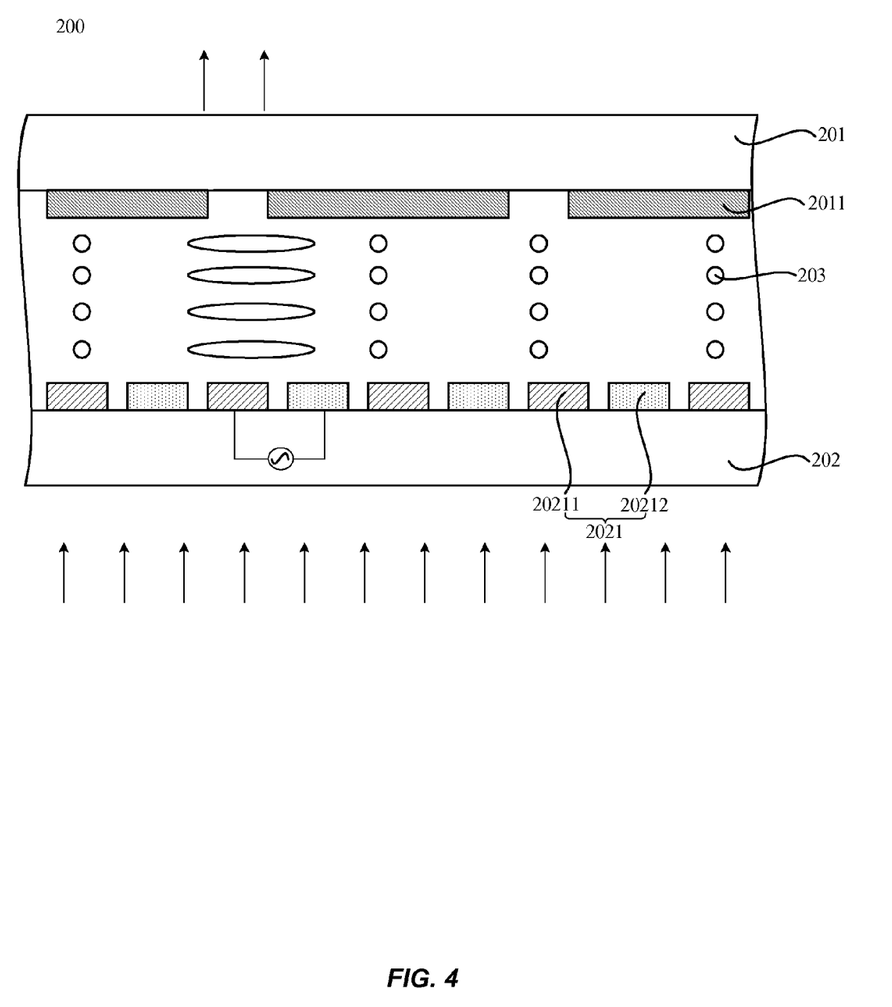
FIG. 4 is a schematic operation diagram of display of an in-cell touch screen according to an embodiment of the present invention.

As shown in FIG. 4, the common electrode 20211 and the pixel electrode 20212 are both located on the array substrate 202, and liquid crystal molecules of the liquid crystal layer 203 are arranged in parallel along the array substrate 202. When the common electrode 20211 and the pixel electrode 20212 are floated (i.e., no voltage is applied), the liquid crystal molecules are not affected by any electric field and will not rotate, therefore the transmissivity of the in-cell touch screen 200 will not change. When a corresponding voltage is applied to the common electrode 20211 and the pixel electrode 20212, an electric field in parallel with the array substrate 202 may be generated between the common electrode 20211 and the pixel electrode 20212, the liquid crystal molecules will rotate under the action of the electric field, thus changing the transmissivity of the in-cell touch screen 200. If the in-cell touch screen is in a normal black mode (i.e., displaying black when no voltage is applied), when a change of the transmissivity of the in-cell touch screen 200 is caused by applying a voltage to the display electrode 2021, the region where the transmissivity changes will allow light to pass through.

Figure 5:
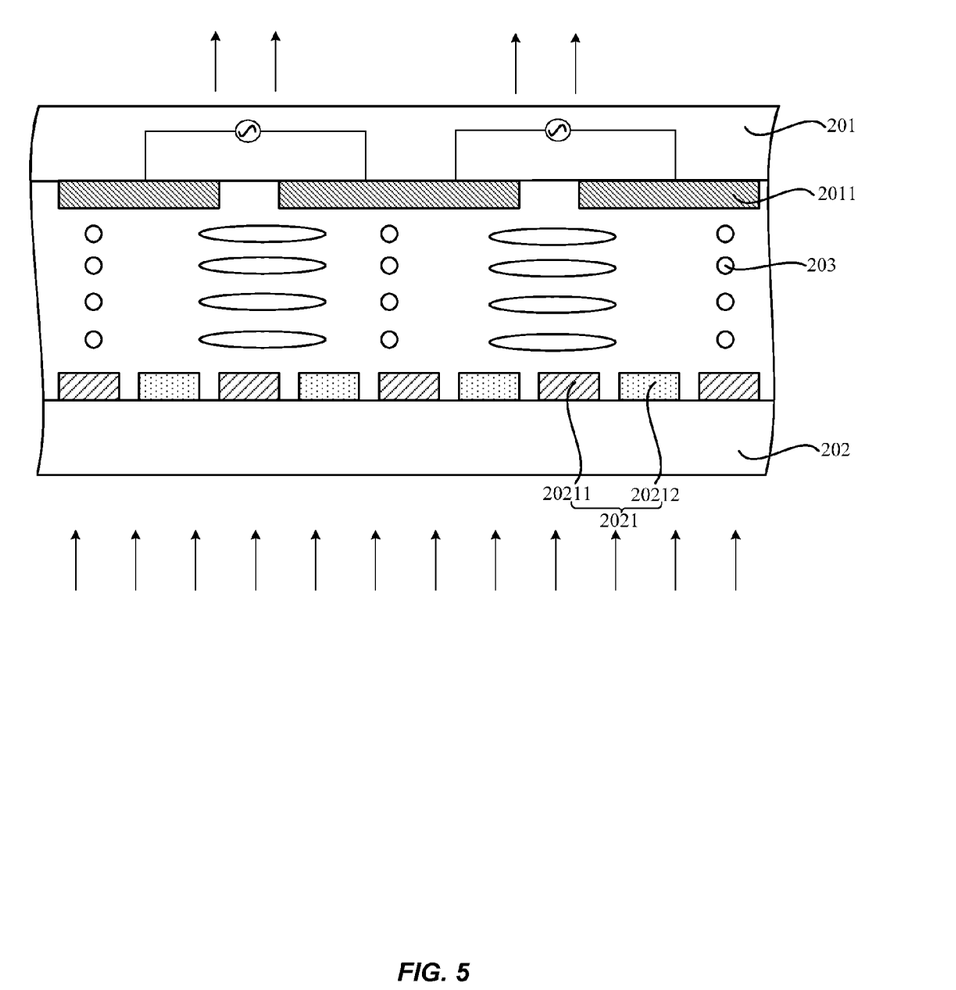
FIG. 5 is a schematic operation diagram of an electrical testing method of an in-cell touch screen according to an embodiment of the present invention.

Similarly, it is known from combining FIG. 3 with FIG. 5 that an electric field in parallel with the color film substrate 201 will be generated between adjacent driving lines 20111 by floating the display electrode 2021, applying a predetermined voltage to one column of adjacent columns of the driving line 20111, and grounding the other column of the driving line 20111. The liquid crystal molecules may rotate correspondingly under the action of the electric field, which changes the transmissivity of the region between the adjacent driving lines 20111, and thus causing the region between the adjacent driving lines 20111 to display white, and the region covered by the driving line 20111 itself will display black due to inexistence of electric field. That is to say, white is displayed in the region where an electric field is generated, and black is displayed in the region without electric field. In other words, conditions of a display picture reflect completely conditions of an electric field distribution, and the electric field distribution lies on conditions of electrode lines establishing the electric field. Therefore, the conditions of the electrode lines may be investigated by observing the display picture. Specifically, whether the driving line 20111 and the detecting line 20112 are shorted and/or opened may be tested by observing a picture. In the present invention, the in-cell touch screen displays are mainly in IPS mode and FFS mode.

An electrical testing method of an in-cell touch screen according to an embodiment of the present invention will be described in detail as follows, and the method includes the following steps 1 to step 3.

Figure 6:
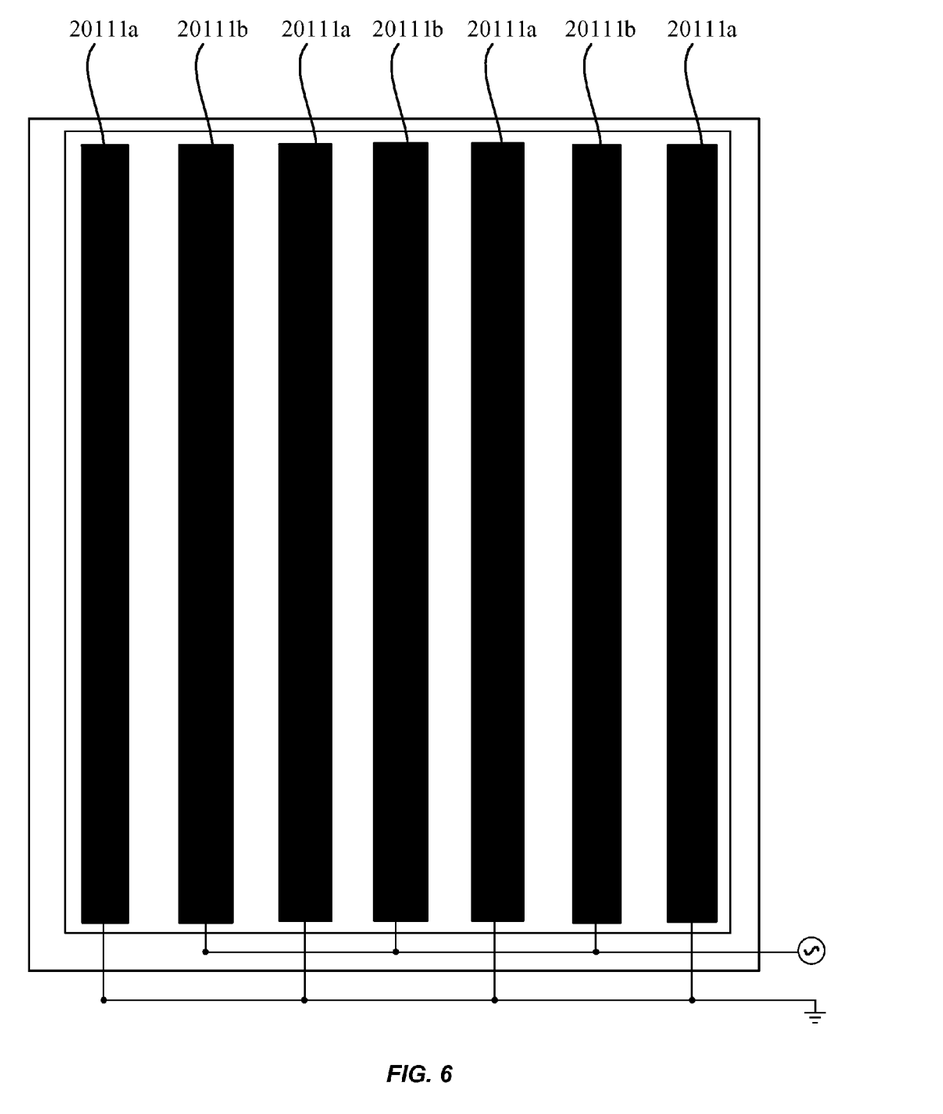
FIG. 6 is a display picture in which a driving line is not shorted or opened in an electrical testing method of an in-cell touch screen according to an embodiment of the present invention.

Step 1, as shown in FIG. 6, floating the display electrode 2021, applying a predetermined voltage to one column of adjacent columns of the driving line 20111, and grounding the other column of the adjacent columns of the driving line 20111. In FIG. 6, it is shown that the predetermined voltage is applied to the even columns of the driving line 20111 and the odd columns of the driving line 20111 are grounded. Practically, a predetermined voltage may be applied to the odd columns of the driving line 20111, and the even columns of the driving line 20111 may be grounded. It is known in conjunction with FIG. 5 that an electric field in parallel with the color film substrate 201 may be generated between adjacent driving lines 20111, and there is no electric field in the region covered by the driving line 20111 itself, therefore white is displayed in the region between the adjacent driving lines 20111, and black is displayed in the region covered by the driving line 20111 itself. In other words, the display picture of the in-cell touch screen here is a picture of alternating white and black lines.

Figure 7:
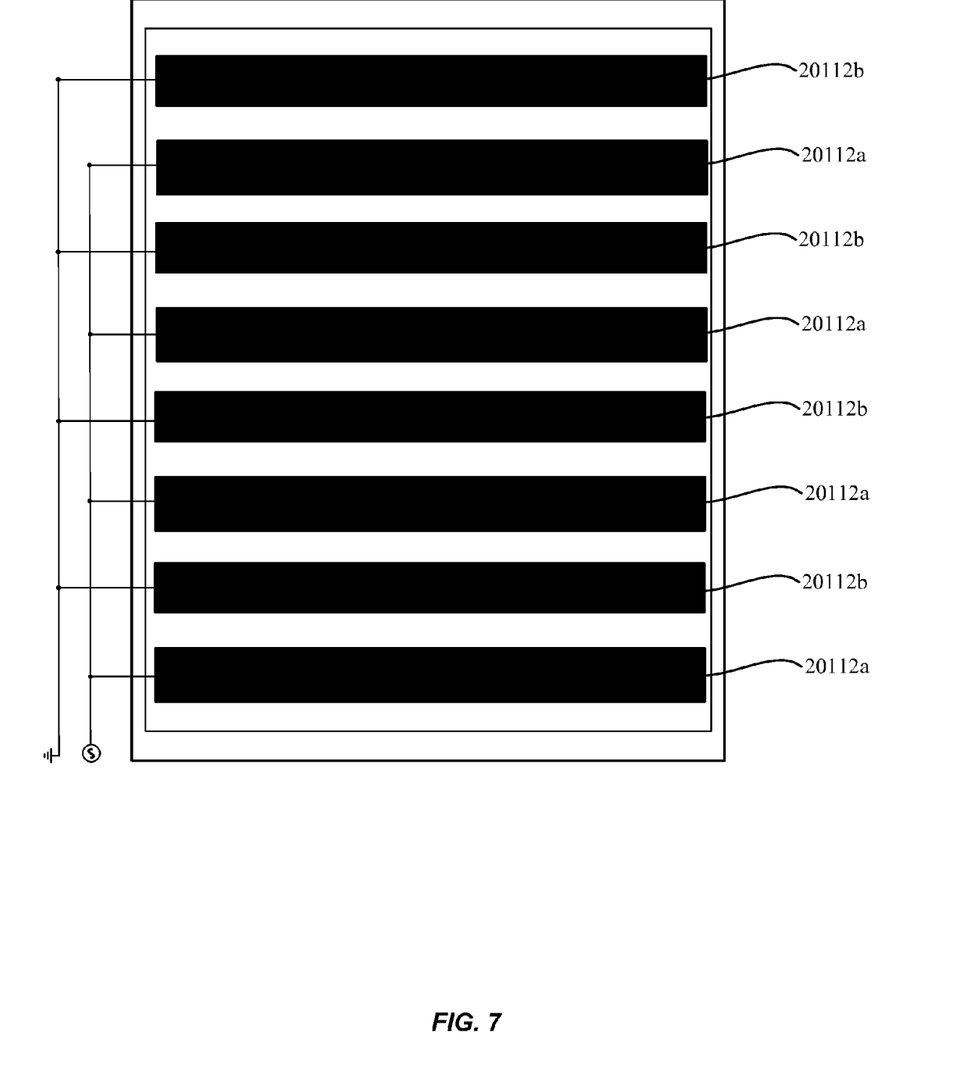
FIG. 7 is a display picture in which a detecting line is not shorted or opened in an electrical testing method of an in-cell touch screen according to an embodiment of the present invention.

In addition, as shown in FIG. 7, the same method may also be implemented on the detecting line 20112, i.e., floating the display electrode 2021, applying a predetermined voltage to one row of adjacent rows of the detecting line 20112, and grounding the other row of the adjacent rows of the detecting line 20112. It is known in conjunction with FIG. 5 that an electric field in parallel with the color film substrate 201 may be generated between adjacent detecting lines 20112, and a display picture of alternating white and black lines may also be displayed.

Specifically, the degree of whitening of the white lines of the display picture lies on the intensity of the electric field between the driving line 20111a and the adjacent driving line 20111b or between the detecting line 20112a and the adjacent detecting line 20112b. And the intensity of the electric field lies on the predetermined voltage. The higher the predetermined voltage is, the greater the intensity of the electric field is; the higher the degree of whitening of the white lines is, the higher the contrast of the display picture is, and it is easier to observe. Preferably, the range of the predetermined voltage is 5V to 10V.

A display examining device may be used as the device for detecting a voltage applied to the driving line 20111 or the detecting line 20112. The display examining device includes a first group of probes and a second group of probes. The first group of probes is corresponding to the display electrode 2021. The second group of probes includes a second group of driving probes and a second group of detecting probes. The second group of driving probes is corresponding to the driving line 20111, and the second group of detecting probes is corresponding to the detecting line 20112.

When it needs to perform display examination on the in-cell touch screen 200, the first group of probes may be pressed onto and connected with the display electrode 2021, and a display voltage is applied to the display electrode 2021, then the display examination may be performed. When it needs to test whether the driving line 20111 of the touch layer 201 is shorted and/or opened, the first group of probes may be lifted to float the display electrode 2021, and the second group of driving probes may be pressed and connected onto the driving line 20111, a predetermined voltage is applied to one column of the adjacent columns of the driving line 20111, and the other column of the adjacent columns of the driving line 20111 is grounded. When it needs to test whether the detecting line 20112 of the touch layer 201 is shorted and/or opened, the first group of probes may be lifted to float the display electrode 2021, and the second group of detecting probes are pressed onto and connected with the detecting line 20112, a predetermined voltage is applied to one row of the adjacent rows of the detecting line 20112, and the other row of the adjacent rows of the detecting line 20112 is grounded.

Two types of examinations, i.e., display examination and touch layer examination, may be performed by using the aforementioned display examining device. A switch between the display examination and the touch layer examination may be completed by selecting the first group of probes or the second group of probes. Therefore the display examination and the touch layer examination may be integrated and completed at one station. The aforementioned display examination is simple, convenient and easy to operate. Moreover, for the examination of the touch layer, conditions in which all the driving lines 20111 or all the detecting lines 20112 are shorted and/or opened may be examined simultaneously, by which the examining efficiency is effectively improved.

Step 2, observing a display picture of the in-cell touch screen, and judging whether the driving line 20111 or the detecting line 20112 is shorted and/or opened. The specific judging method is as follows.

As shown in FIG. 6 and FIG. 7, if the white lines and the black lines of the display picture are arranged in parallel periodically and have no breaks or deletions, it indicates that an electric field is generated between any adjacent driving lines 20111 or between any adjacent detecting lines 20112, that is, it indicates that each driving line 20111 or each detecting line 20112 is conductive and is not shorted, therefore it may be judged that neither of the driving lines 20111 nor the detecting lines 20112 is shorted or opened.

Figure 8A:
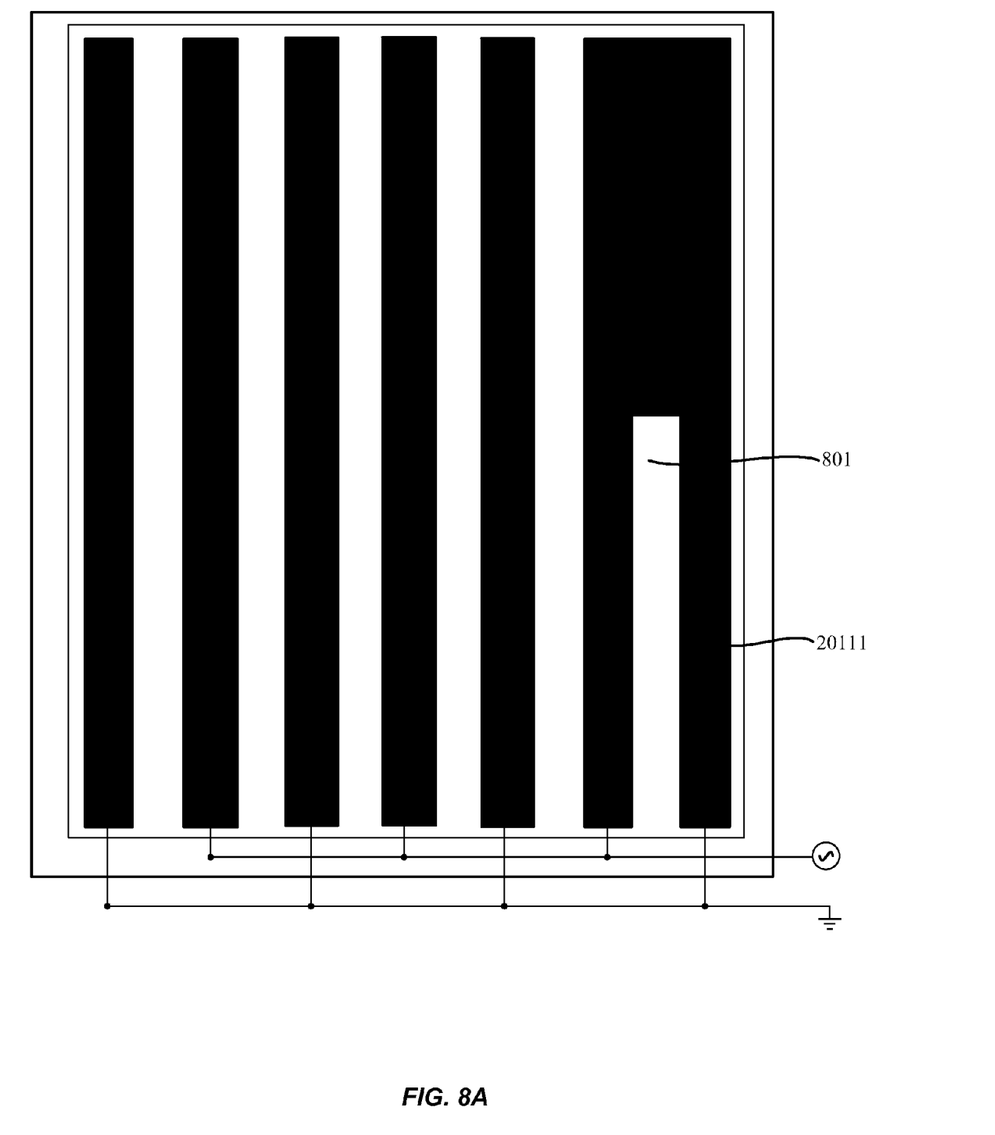
FIG. 8A is a display picture in which a driving line is opened in an electrical testing method of an in-cell touch screen according to an embodiment of the present invention.

As shown in FIG. 8A, which is a display picture in which a driving line is opened, and each black line is corresponding to one driving line 20111. If one white line 801 of the display picture has a break or a deletion, it indicates that no electric field is generated in the region where the white line has the break or the deletion. In other words, no electric field is generated between the adjacent driving lines 20111 where the white line 801 has the break. Therefore it may be judged that the driving line 20111 corresponding to the white line is opened.

Figure 8B:
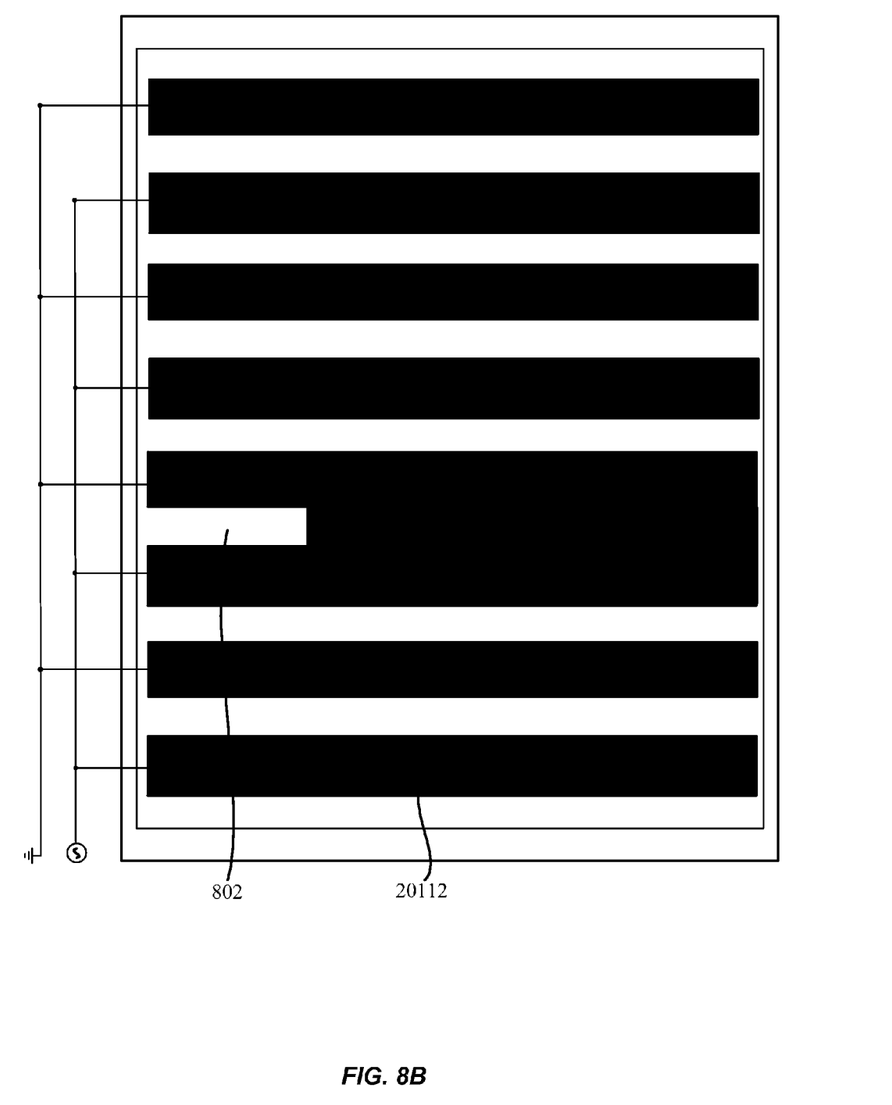
FIG. 8B is a display picture in which a detecting line is opened in an electrical testing method of an in-cell touch screen according to an embodiment of the present invention.

Similarly, as shown in FIG. 8B, which is a display picture in which a detecting line is opened, each black line is corresponding to one detecting line 20112. If one white line 802 of the display picture has a break or a deletion, it indicates that no electric field is generated in the region where the white line has the break or the deletion. In other words, no electric field is generated between the adjacent detecting lines 20112 where the white line 802 has the break. Therefore it may be judged that the detecting line 20112 corresponding to the white line is opened.

Figure 9A:
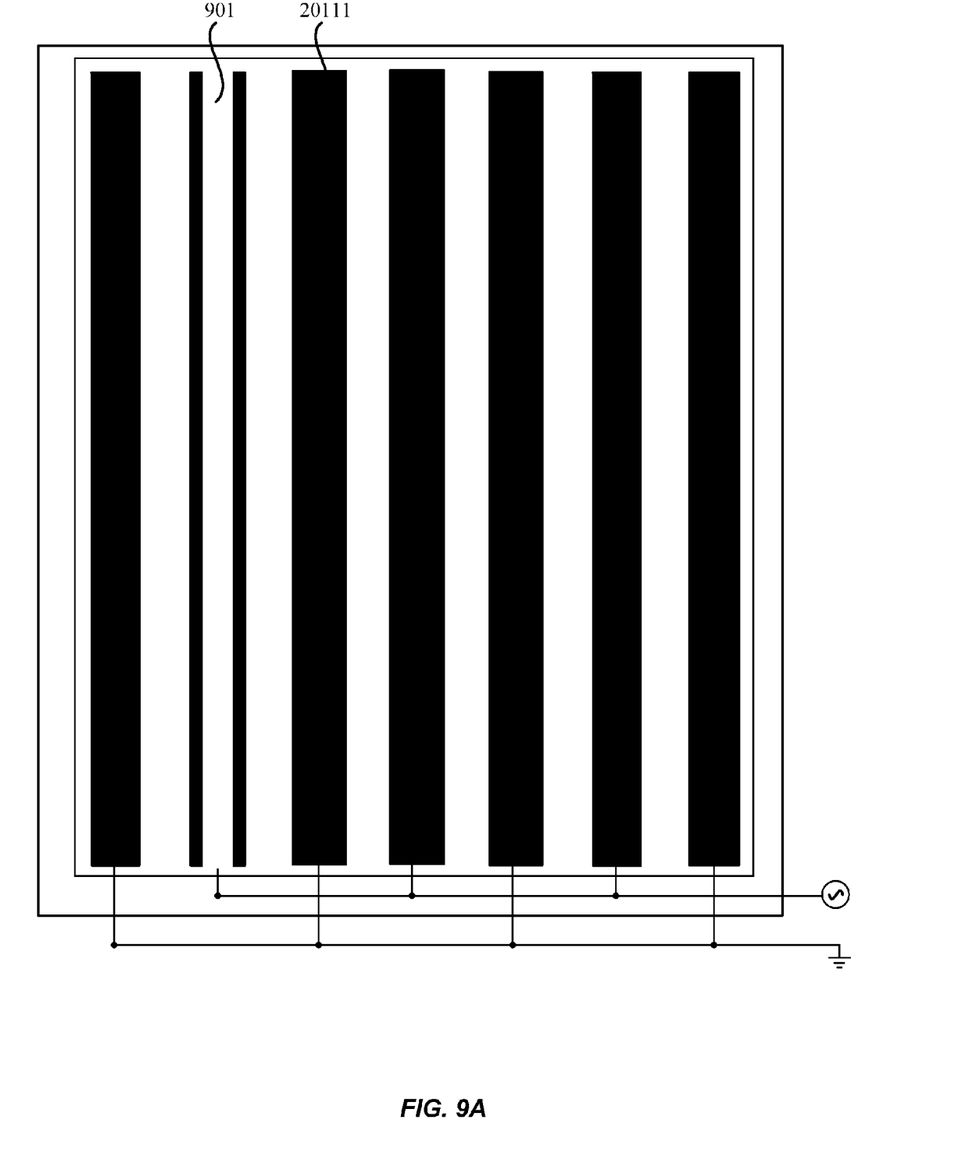
FIG. 9A and FIG. 9B are display pictures in which adjacent driving lines or adjacent detecting lines are shorted in an electrical testing method of an in-cell touch screen according to an embodiment of the present invention.

As shown in FIG. 9A, which is a display picture in which adjacent driving lines 20111 are shorted, each black line is corresponding to one driving line 20111. If one black line 901 of the display picture has a deletion (i.e., the width of one black line is smaller than a normal value), it indicates that an electric field exists in the region where the black line has the deletion. In other words, a voltage is applied to the driving line 20111 where the black line has the deletion. Therefore it may be judged that the driving line 20111 corresponding to the black line is shorted with its adjacent driving line 20111.

Figure 9B:
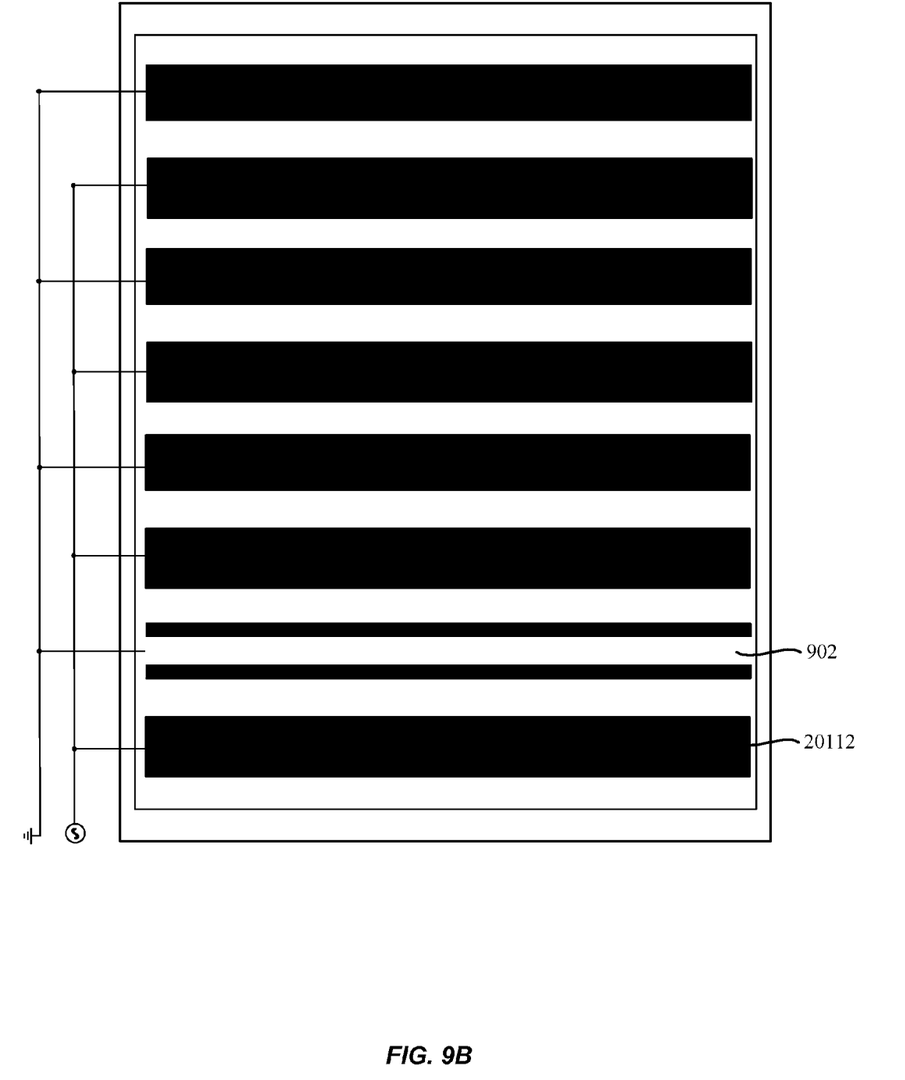

Similarly, as shown in FIG. 9B, which is a display picture in which adjacent detecting lines 20112 are shorted, each black line is corresponding to one detecting line 20112. If one black line 902 of the display picture has a deletion (i.e., the width of one black line is smaller than a normal value), it indicates that an electric field exists in the region where the black line has the deletion. In other words, a voltage is applied to the detecting line 20112 where the black line has the deletion. Therefore it may be judged that the detecting line 20112 corresponding to the black line is shorted with its adjacent detecting line 20112.

Figure 10A:
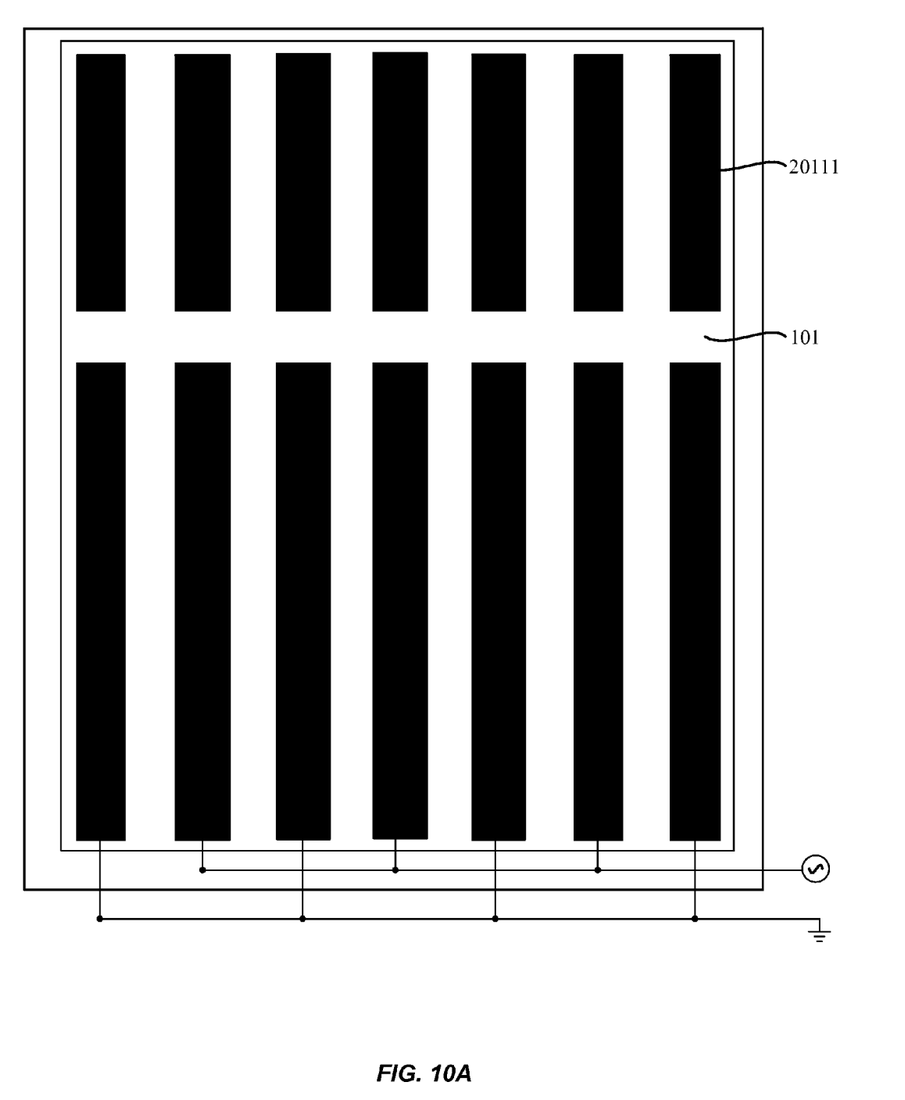
FIG. 10A and FIG. 10B are display pictures in which a driving line is shorted with a detecting line in an electrical testing method of an in-cell touch screen according to an embodiment of the present invention.

As shown in FIG. 10A, which is a display picture in which a driving line 20111 is shorted with a detecting line 20112, each black line is corresponding to one driving line 20111. If there is a white line 101 which is perpendicularly intersected with a black line in the display picture, it indicates that an electric field also exists in the region corresponding to the white line which is perpendicularly intersected with the black line, and the detecting line 20112 is located in the region corresponding to the white line, therefore it may be judged that the driving lines 20111 is shorted with the detecting line 20112 at the intersection.

Figure 10B:
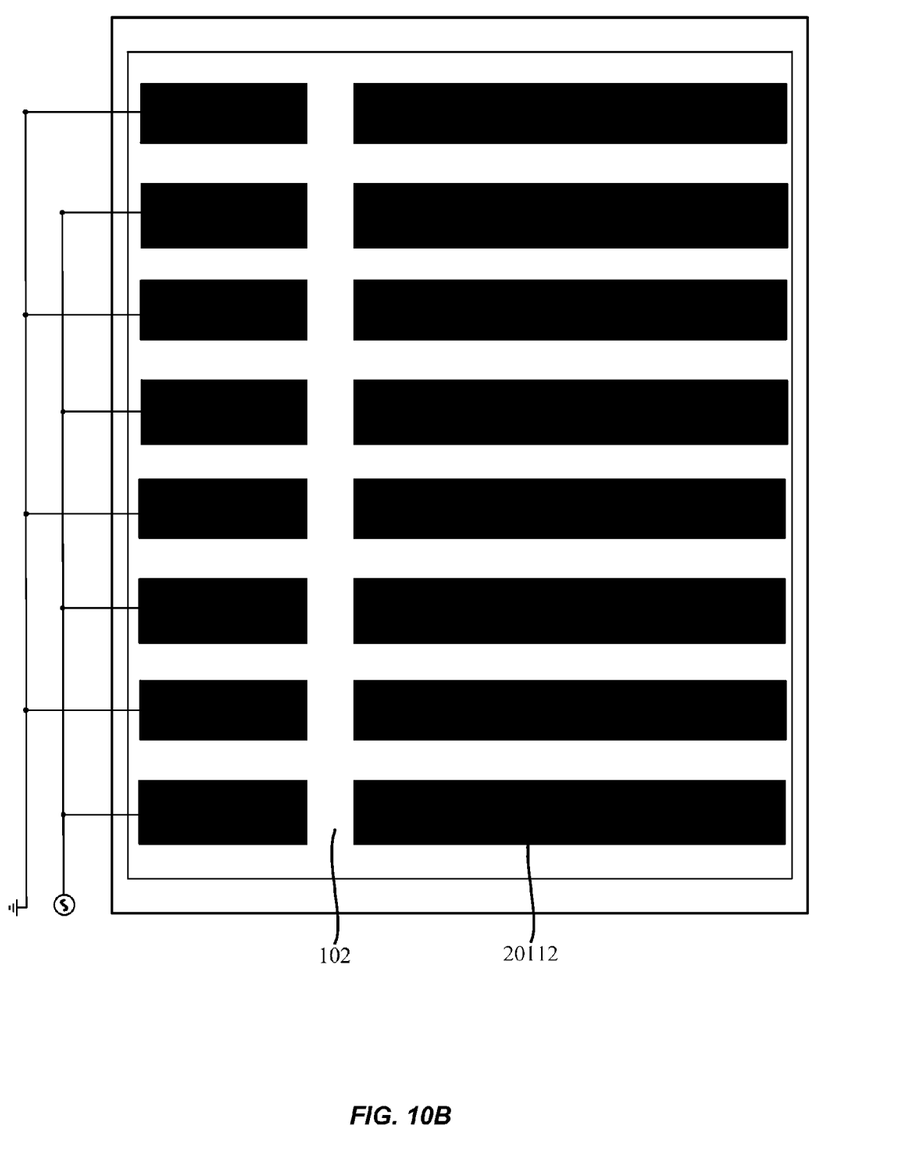

Similarly, as shown in FIG. 10B, which is another display picture in which a driving line 20111 is shorted with a detecting line 20112, each black line is corresponding to one detecting line 20112. If there is a white line 102 which is perpendicularly intersected with a black line in the display picture, it indicates that an electric field also exists in the region corresponding to the white line which is perpendicularly intersected with the black line, and the driving line 20111 is located in the region corresponding to the white line, therefore it may be judged that the driving line 20111 is shorted with the detecting lines 20112 at the intersection.

Figure 11:
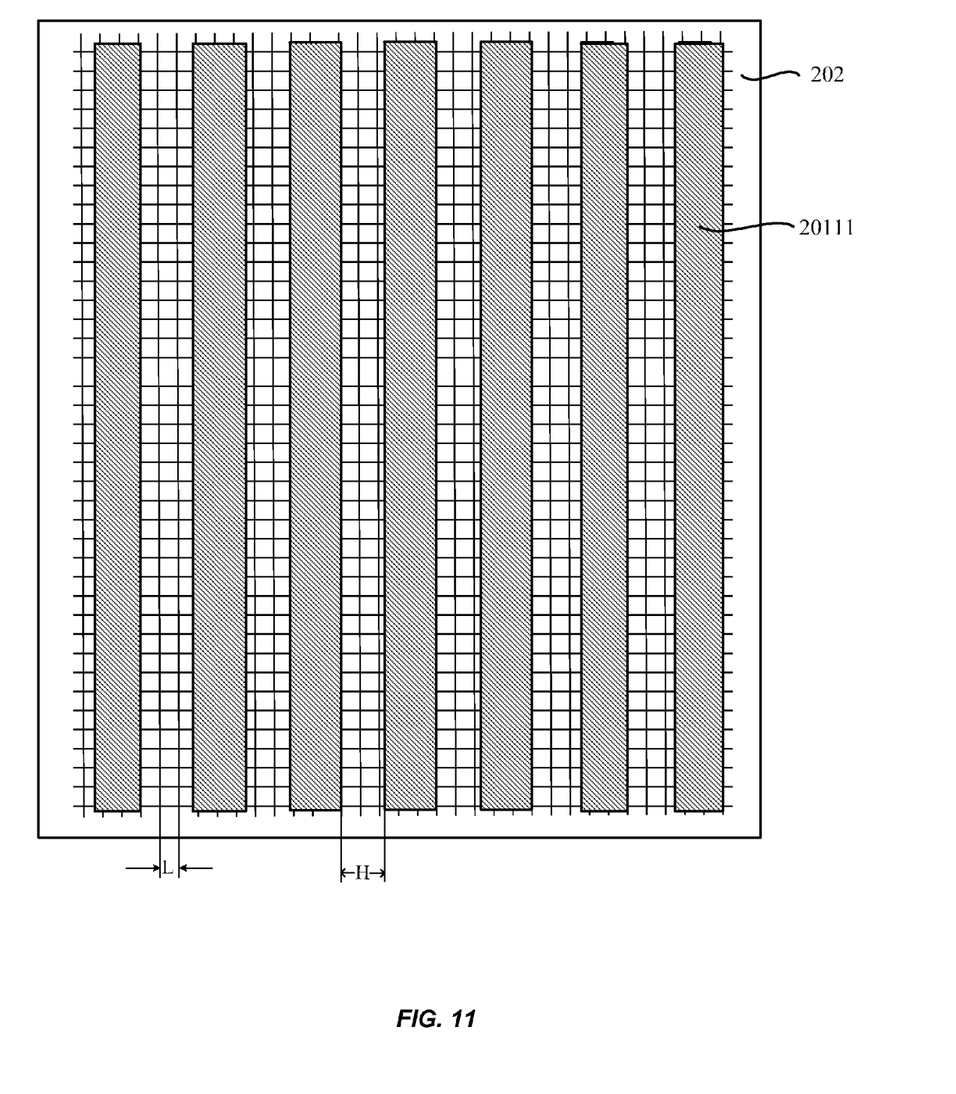
FIG. 11 is a distribution diagram of a pixel array and driving lines of an in-cell touch screen according to an embodiment of the present invention.

As shown in FIG. 11, the array substrate 202 includes a pixel array, and the width of each column of pixels is L. In the aforementioned picture of alternating white and black lines, the space between the black lines lies on the space H between adjacent driving lines 20111 or adjacent detecting lines (not shown in figure), the greater the space H is, the greater the width of the white line is. For convenience of observation, preferably, the distance between adjacent driving lines 20111 or adjacent detecting lines may be set to be smaller than or equal to 10 times of the width L of a pixel column of the pixel array. For convenience of illustration, only the driving line 20111 is shown in the FIG. 11, and the detecting line is not shown.

In conjunction with FIG. 6 to FIG. 11, the judgment in step 2 is based on the display picture which is generated by establishing an electric field between adjacent driving lines 20111 or adjacent detecting lines 20112, without directly measuring capacitance between the driving line 20111 and the detecting line 20112, and further in order to improve the accuracy rate, after the judgment of step 2, capacitance measurement may be directly performed on the driving line 20111 or detecting line 20112 which has been judged to be shorted and/or opened, so as to determine whether the judgment of step 2 is correct. Specifically, after step 2, a step 3 is included as below.

Step 3, measuring, by using a multimeter, capacitance between the driving line 20111 which has been judged to be shorted and/or opened in step 2 and the ground or between the detecting line 20112 which has been judged to be shorted and/or opened in step 2 and the ground, and determining whether the judgment in step 2 is correct according to the capacitance. If the capacitance is greater than 150% of a specified capacitance value or smaller than 50% of the specified capacitance value, it is determined that the judgment of step 2 is correct.

In conclusion, in the aforementioned electrical testing method of an in-cell touch screen, conditions of the driving line or the detecting line is shorted and/or opened are displayed through a display picture which can be observed visually. Positions at which the driving line and/or the detecting line is shorted and/or opened may be seen from the display picture without special waveform comparisons. By the convenient and accurate testing method, the testing efficiency is effectively improved and the testing cost is reduced.

Apparently, various changes and variations may be made to the present invention by those skilled in the art without departing from the spirit and scope hereof. Therefore, if these modifications and variations are within the scope of the claims of the present invention and equivalent technologies thereof, the present invention is intended to include these changes and variations.

What is claimed is:

1. A method of electrically testing an in-cell touch screen, the in-cell touch screen comprising: a display electrode, a driving line, and a detecting line, wherein the detecting line intersects the driving line, wherein the method comprises:
    floating the display electrode;
    performing at least one of:
        A) applying a first predetermined voltage to one column of adjacent columns of the driving line or one row of adjacent rows of the driving line, and grounding the other column of the adjacent columns of the driving line or the other row of the adjacent rows of the driving line; and
        B) applying a second predetermined voltage to one column of adjacent columns of the detecting line or one row of adjacent rows of the detecting line, and grounding the other column of the adjacent columns of the detecting line or the other row of the adjacent rows of the detecting line;
    observing a display picture of the in-cell touch screen; and
    determining whether the driving line or the detecting line is shorted or opened.

2. The method of electrically testing the in-cell touch screen according to claim 1, wherein the display picture comprises alternating white and black lines.

3. The method of electrically testing the in-cell touch screen according to claim 2, wherein the driving line or the detecting line is determined not to be shorted or opened if the white lines and the black lines of the display picture are arranged in parallel periodically and have no breaks or deletions.

4. The method of electrically testing the in-cell touch screen according to claim 2, wherein the driving line or the detecting line is determined to be shorted or opened if one of the white lines of the display picture has a break or a deletion.

5. The method of electrically testing the in-cell touch screen according to claim 2, wherein the driving line or the detecting line corresponding to one of the black lines is determined to be shorted with an adjacent line if the one black line of the display picture has a deletion.

6. The method of electrically testing the in-cell touch screen according to claim 2, wherein the driving line is determined to be shorted with the detecting line if the display picture has a white line perpendicularly intersected with a black line.

7. The method of electrically testing the in-cell touch screen according to claim 1, wherein a display examining device is used to apply voltages to the in-cell touch screen and to observe the display picture of the in-cell touch screen, wherein the display examining device has a first group of probes and a second group of probes, the first group of probes corresponding to the display electrode, and the second group of probes corresponding to the driving line or the detecting line.

8. The method of electrically testing the in-cell touch screen according to claim 7, wherein:
    the first group of probes are disconnected from the display electrode so that the display electrode is floated;
    the second group of probes are connected to the column or row of the driving line or the detecting line so that the first or second predetermined voltage is applied thereto.

9. The method of electrically testing the in-cell touch screen according to claim 1, wherein the first and second predetermined voltages range from 5V to 10V.

10. The method of electrically testing the in-cell touch screen according to claim 1, further comprising at least one of:
    A) measuring capacitance between a driving line determined to be shorted and/or opened and the ground, and
    B) measuring capacitance between the detecting line determined to be shorted and/or opened and the ground; and
    verifying the determination according to the capacitance measurement.

11. The method of electrically testing the in-cell touch screen according to claim 10, wherein if the capacitance is greater than 150% of a specified capacitance value or smaller than 50% of the specified capacitance value, it is verified that the determination is correct.

12. The method of electrically testing the in-cell touch screen according to claim 10, wherein a multimeter is used to measure the capacitance.

13. The method of electrically testing the in-cell touch screen according to claim 1, wherein the array substrate further comprises a pixel array, and the distance between adjacent driving lines or adjacent detecting lines is less than or equal to 10 times of the width of a pixel column of the pixel array.

* * * * *